United States Patent [19]
Kawagoe et al.

[11] 3,991,326
[45] Nov. 9, 1976

[54] MISFET SWITCHING CIRCUIT FOR A HIGH WITHSTAND VOLTAGE

[75] Inventors: Hiroto Kawagoe; Haruo Keida, both of Kodaira, Japan

[73] Assignee: Hitachi, Ltd., Japan

[22] Filed: Nov. 21, 1975

[21] Appl. No.: 634,189

[30] Foreign Application Priority Data
Nov. 22, 1974 Japan.............................. 49-133664

[52] U.S. Cl................................. 307/270; 307/205; 307/214; 340/324 R; 340/343
[51] Int. Cl.² ................ H03K 19/08; H03K 19/40; H05B 39/00
[58] Field of Search ........... 307/205, 214, 270, 304; 340/324 R, 336, 343; 350/160 LC

[56] References Cited
UNITED STATES PATENTS

| | | | |
|---|---|---|---|
| 3,723,749 | 3/1973 | Shapiro........................... | 340/336 X |
| 3,851,185 | 11/1974 | Hatsukano et al.................. | 307/205 |
| 3,867,646 | 2/1975 | McCoy........................... | 307/205 X |
| 3,896,430 | 7/1975 | Hatsukano........................ | 340/336 |

FOREIGN PATENTS OR APPLICATIONS
4,995,561  9/1974  Japan................................. 307/270

*Primary Examiner*—John S. Heyman
*Assistant Examiner*—Larry N. Anagnos
*Attorney, Agent, or Firm*—Craig & Antonelli

[57] ABSTRACT

A switching circuit for use as, e.g., a digitron driver circuit in an electronic desk top calculator, comprises a driving MISFET whose source terminal is connected to a ground reference potential, at least one protective MISFET whose source terminal is connected to a drain terminal of the driving MISFET, and a bias power source which is connected through a load to a drain terminal of the protective MISFET. A d.c. voltage is applied to a gate terminal of the protective MISFET and an output signal is derived from the drain terminal of the protective MISFET on the basis of an input signal which is supplied to a gate terminal of the driving MISFET. The driving MISFET is an enhancement mode transistor, while the protective MISFET is a depletion mode transistor, whereby the withstand voltage of the switching circuit is enhanced.

4 Claims, 5 Drawing Figures

3,991,326

MISFET SWITCHING CIRCUIT FOR A HIGH WITHSTAND VOLTAGE

BACKGROUND OF THE INVENTION

This invention relates to a MISFET switching circuit having a high withstand voltage.

In general, the gate-drain voltage of an insulated gate field-effect transistor (MISFET) at the time when the drain junction breaks down is as low as several tens of volts (for example, 20 V). For this reason, a high supply voltage cannot be used for a circuit usually constructed of MISFETs, such as a circuit for an electronic desk top calculator, and the use of the MISFET has been restricted. In, for example, a display element driver circuit for indicating a calculated result etc., the driving voltage of a display element is 25 V – 50 V and is somewhat higher than the withstand voltage of the MISFET, and hence, the display element cannot be directly driven by the MISFET. The driver circuit has therefore been constructed of bipolar transistors etc. In the electronic desk top calculator, accordingly, the display element driver circuit and a control circuit cannot be put into an IC (integrated circuit) on an identical chip. This poses a problem for the fabricating process, cost reduction, etc.

"In order to solve the problem, a circuit arrangement as described in Japanese patent application No. 5971/1973, laid open as Laid Open Print No. 95561/1974 to public inspection in Japan on Sept. 10, 1974 has been proposed." FIG. 1 of the accompanying drawing shows the digitron driver circuit proposed.

Referring to the figure, $Q_A$ designates an enhancement mode driving MISFET, while $Q_B$ denotes an enhancement mode protecting MISFET. The MISFET $Q_A$ has its source terminal grounded, and has its drain terminal connected to the source terminal of the MISFET $Q_B$.

The drain terminal of the MISFET $Q_B$ is connected through a load resistance R to a bias supply voltage $V_{DD}$. An output is derived from the drain terminal of the MISFET $Q_B$, to drive a digitron D.A control input signal $V_{in}$ is applied to the gate terminal of the MISFET $Q_A$, while a d.c. voltage $V_{GG}$ is applied to the gate terminal of the MISFET $Q_B$.

In the driver circuit, the maximum value of the bias supply voltage as applied to the drain terminal of the MISFET $Q_B$ when the MISFET $Q_A$ is in the "off" state becomes $|BV_2| - |V_{GG} - V_{thE}|$. This voltage is the digitron driving voltage.

SUMMARY OF THE INVENTION

This invention consists in making improvements in the above driver circuit so as to improve its withstand voltage.

It is, accordingly, an object of this invention to provide a switching circuit for high output voltages employing MISFETs known at present.

The fundamental construction of this invention for accomplishing the object resides in a switching circuit comprising a driving MISFET whose source terminal is connected to a ground reference potential, at least one protective MISFET whose source terminal is connected to a drain terminal of the driving MISFET, and a bias power source which is connected through a load to a drain terminal of the protective MISFET, a d.c. voltage being applied to a gate terminal of the protective MISFET, an output signal being derived from the drain terminal of the protective MISFET on the basis of an input signal which is supplied to a gate terminal of the driving MISFET, characterized in that the driving MISFET an enhancement mode transistor, while the protective MISFET is a depletion mode transistor.

DETAILED DESCRIPTION OF THE INVENTION

Figure 2A:
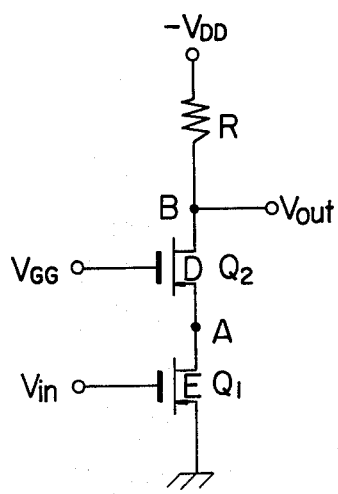
FIGS. 2a to 2c are diagrams of switching circuits according to this invention.

In FIG. 2a, the drain terminal of any enhancement mode driving MISFET $Q_1$ is connected to the source terminal of a depletion mode. The source terminal of the driving MISFET $Q_1$ is grounded. A control input signal $V_{in}$ having an off level $V_H$ (ground potential) or an "on" level $V_L$ (negative potential) is applied to the gate of the driving MISFET $Q_1$. To the gate terminal of the protecting MISFET $Q_2$, there is applied the following d.c. constant voltage $V_{GG}$:

$$|BV_1| + |V_{thD}| > |V_{GG}| > |V_{DD}| - |BV_2| \qquad (1)$$

(where $BV_1$ and $BV_2$ denote the gate-drain voltages at the time when the respective drain junctions of the driving MISFET $Q_1$ and the protecting MISFET $Q_2$ break down, the $V_{thD}$ denotes the threshold voltage of the protecting MISFET $Q_2$, and $V_{DD}$ denotes the supply voltage.)

Further, the drain terminal of the protective MISFET $Q_2$ is connected through a load resistance R to a bias supply voltage $V_{DD}$. An output voltage is derived from the drain terminal of the protective MISFET $Q_2$.

Figure 2B:
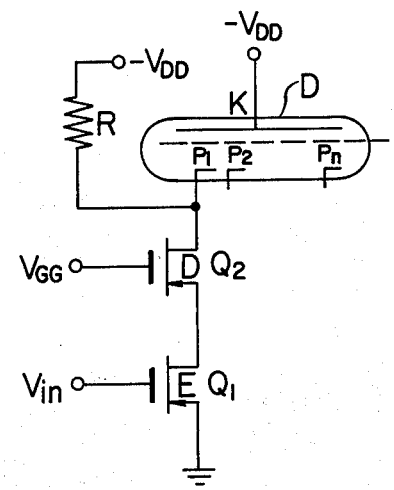

FIG. 2b shows a driver circuit which controls the lighting of a fluorescent display tube, such as digitron, D by the use of the switching circuit illustrated in FIG. 2a.

Figure 2C:
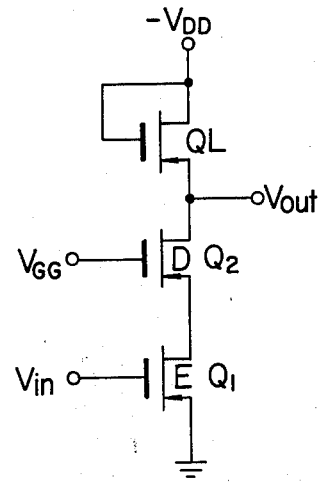

FIG. 2c shows a circuit in which a MISFET for load $Q_L$ is used in lieu of the load resistance R in the switching circuit illustrated in FIG. 2a.

Figure 3:
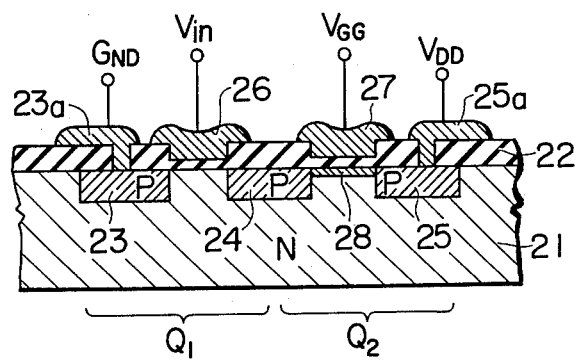
FIG. 3 is a structural view of the switching circuit according to this invention as constructed in a semiconductor substrate.

FIG. 3 is a structural view in the case where the driving MISFET $Q_1$ and the protective MISFET $Q_2$ are constructed in a semiconductor substrate.

Referring to FIG. 3, numeral 21 designates an N-type semiconductor substrate, numeral 22 an insulating film, numeral 23 a source of region of the driving MISFET $Q_1$, numeral 25 a drain region of the protective MISFET $Q_2$, and numeral 24 a semiconductor region which is used commonly as a source region of the protective MISFET $Q_2$ and a drain region of the driving MISFET $Q_1$ in order to simplify the wiring. 23a represents a source electrode, 25a a drain electrode, and 26 and 27 are gate electrodes. Shown at 28 is a depletion channel layer of the protective MISFET $Q_2$.

Assuming in the switching circuit of FIG. 2a that the input voltage $V_{in}$ is at the off level ($V_H = 0$) and that the protective MISFET $Q_2$ is saturated, the potential of a point A (the drain terminal of the MISFET $Q_1$) becomes $V_{GG} - V_{thD}$.

Accordingly, the maximum bias voltage $V_{DH}$ which is applied to a point B (the drain terminal of the MISFET $Q_2$) in FIG. 2a becomes:

$$V_{DH} = |BV_2| - |V_{GG} - V_{thD}| \qquad (2)$$

This voltage $V_{DH}$ is also the output voltage under the off state of the driving MISFET $Q_1$.

Figure 1:
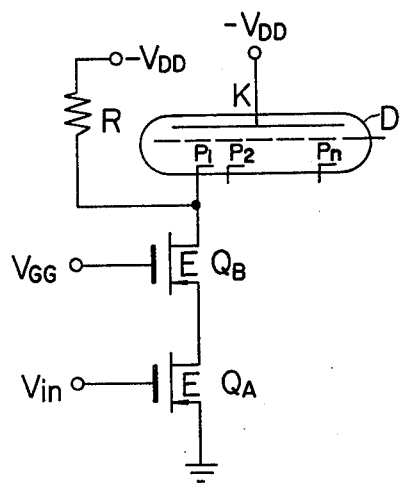
FIG. 1 is a diagram of a prior-art switching circuit constructed of enhancement mode MISFETs.

Here, in the prior-art driver circuit shown in FIG. 1, the enhancement mode of operation is employed for the protective MISFET $Q_2$, so that the maximum bias voltage at this time becomes:

$$V_{DH}' = |BV_2| - |V_{GG} - V_{thE}| \qquad (3)$$

The voltage $V_{thD}$ is positive, whereas the voltage $V_{thE}$ is negative. When Eqs. (2) and (3) are compared, $(V_{DH} - V_{DH}')$ equal $(V_{thD} - V_{thE})$, and the bias voltage $V_{DH}$ is higher by the component of the sum between the threshold voltages $V_{thD}$ and $V_{thE}$. By way of example, when $V_{thD} = 2.8$ volts and $V_{thE} = -1.3$ volts, the difference between both the bias voltages becomes:

$$2.8 - (-1.3) = 2.8 + 1.3 = 4.1 \text{ volts.}$$

The bias voltage can be increased by 4.1 volts. This signifies that the output voltage can also be increased.

Needless to say, the embodiments can be constructed of N-channel MISFETs. In this case, the relations of the respective voltages are reversed.

As explained above, a higher output voltage can be attained with the switching circuit of high withstand voltage MISFETs according to this invention than with the prior-art circuit composed only of the enhancement mode MISFETs. In addition, a higher bias supply voltage can be impressed with the conventional MISFETs (the enhancement of the withstand voltage).

We claim:
1. In a MISFET switching circuit comprising:
   a driving MISFET the source terminal of which is connected to a first reference potential;
   at least one protective MISFET the source terminal of which is connected to the drain terminal of the driving MISFET; and
   a bias power source which is connected through a load to the drain terminal of the protective MISFET;
   a d.c. voltage being applied to the gate terminal of the protective MISFET;
   an output signal being derived from the drain terminal of the protective MISFET in response to an input signal supplied to the gate terminal of the driving MISFET;
   the improvement wherein said driving MISFET is an enhancement mode transistor, while said protective MISFET is a depletion mode transistor, thereby increasing the withstand voltage of the MISFET switching circuit.

2. The improvement according to claim 1, wherein said first reference potential is ground potential.

3. The improvement according to claim 1, wherein said output signal is applied to a digitron display device.

4. The improvement according to claim 1, wherein said output signal is applied to a diode connected load MISFET.

* * * * *